United States Patent [19]

Brown

[11] 4,213,099
[45] Jul. 15, 1980

[54] HYDROPHONE PREAMPLIFIER AND CALIBRATION CIRCUIT

[75] Inventor: Craig K. Brown, Winter Garden, Fla.

[73] Assignee: The United States of America as represented by the Secretary of the Navy, Washington, D.C.

[21] Appl. No.: 962,406

[22] Filed: Nov. 20, 1978

[51] Int. Cl.² .................. H03F 17/00; H03F 3/16
[52] U.S. Cl. ...................... 330/297; 330/2; 330/59; 330/202; 330/300; 330/308
[58] Field of Search ............ 330/2, 59, 199, 202, 330/277, 297, 300, 308

[56] References Cited

U.S. PATENT DOCUMENTS

| | | | |
|---|---|---|---|
| 3,501,711 | 3/1970 | Moran | 330/297 |
| 3,602,830 | 8/1971 | Hurd | 330/297 X |
| 4,009,447 | 2/1977 | Wolf et al. | 330/59 X |
| 4,013,992 | 3/1977 | Dewberry et al. | 340/10 |
| 4,126,830 | 11/1978 | Schade | 330/277 |

*Primary Examiner*—James B. Mullins
*Attorney, Agent, or Firm*—R. S. Sciascia; Philip Schneider

[57] ABSTRACT

Calibration means, including an optiosolator, for a hydrophone preamplifier which couples to a remote DC supply source and a remote load through a long, two-wire cable. The output signal of the optoisolator is fed to the amplifier in series with the hydrophone output signal, the input to the optoisolator being an AC calibration signal. In an array of preamplifiers, the same calibration signal is fed to all the preamplifiers by connecting the optoisolators in series with each other and the source of the AC calibration signal.

6 Claims, 4 Drawing Figures

HYDROPHONE PREAMPLIFIER AND CALIBRATION CIRCUIT

BACKGROUND OF THE INVENTION

This invention relates to hydrophone preamplifiers and especially to a miniature hydrophone preamplifier suitable for use with remote hydrophone arrays.

Most hydrophone preamplifiers used in arrays are not capable of driving extremely long lines, although some contain low-output-impedance, line-driver circuits. When such a preamplifier is used with a two-wire cable, separation of signal and DC power becomes a problem. The designer is forced to either specify a high-impedance load or deliver high current to a low-impedance load. High-impedance loads can cause excessive electrical crosstalk between array outputs, and high-current low-impedance loads waste power. Other preamplifier designs avoid these difficulties by using an output current driver rather than a voltage driver. A low-impedance load can then be used with a small, controlled load current. When such a preamplifier is used with a two-wire cable, however, separation of DC current to and AC signal current from the device is again a problem. This is because the preamplifier supply current is not fixed but varies slightly with the signal. This unwanted ripple in the supply current adds to the AC signal current resulting in an inaccurate output.

Moreover, providing calibration circuitry for array preamplifiers typically requires a separate wire pair for each preamplifier. In an array, this means many more conductors in the cable. Some preamplifier designs avoid this by providing built-in oscillators. These oscillators produce local calibration signals for their respective preamplifiers. But then additional control lines must be provided to turn the oscillators on or off. Other designs use one common calibration line to send a calibration signal to all array preamplifiers. But any common circuit, such as this, creates potential cross-talk between units when they are operating normally with acoustic input signals. To avoid crosstalk via the common calibration line, complete isolation is required between calibration circuits.

Some array designs which use a single-input calibration cable suffer from another shortcoming: due to cable resistance, each calibration circuit along the array receives a slightly different input calibration signal level. Other calibration circuit designs cause the entire preamplifier to fail when the calibration input opens or shorts. All of these calibration, as well as output drive, problems are solved by the present invention.

SUMMARY OF THE INVENTION

The present invention comprises a hydrophone preamplifier for coupling to a remote load and DC voltage supply through a single 2-wire cable. The preamp comprises a hybrid amplifier having a high-impedance input stage comprising a reverse-biased junction FET and an amplifier transistor output stage, the output voltage being fed to a current driver stage which is in series with the remote DC supply voltage and low-valued load resistor. The preamp completely controls the cable current, both supply and signal, by use of a constant-current diode which is inserted in the DC voltage supply line between its connection to the current-driver and the amplifier. A diode (zener diode) in parallel with a capacitor is placed across the amplifier from its DC supply voltage side to its ground side to compensate for differences in the constant-current supply from the constant-current diode and the varying current demanded by the amplifier.

To couple in an AC calibration signal which is superimposed on a DC level, an optoisolator is connected to the preamplifier input so that its output signal is in series with the hydrophone signal (although only one signal is used at a time). In an array of hydrophones and preamps, the optoisolators are connected in series so that only a single calibration source is required and each preamp receives the same calibration signal.

DETAILED DESCRIPTION OF THE INVENTION

Figure 1:
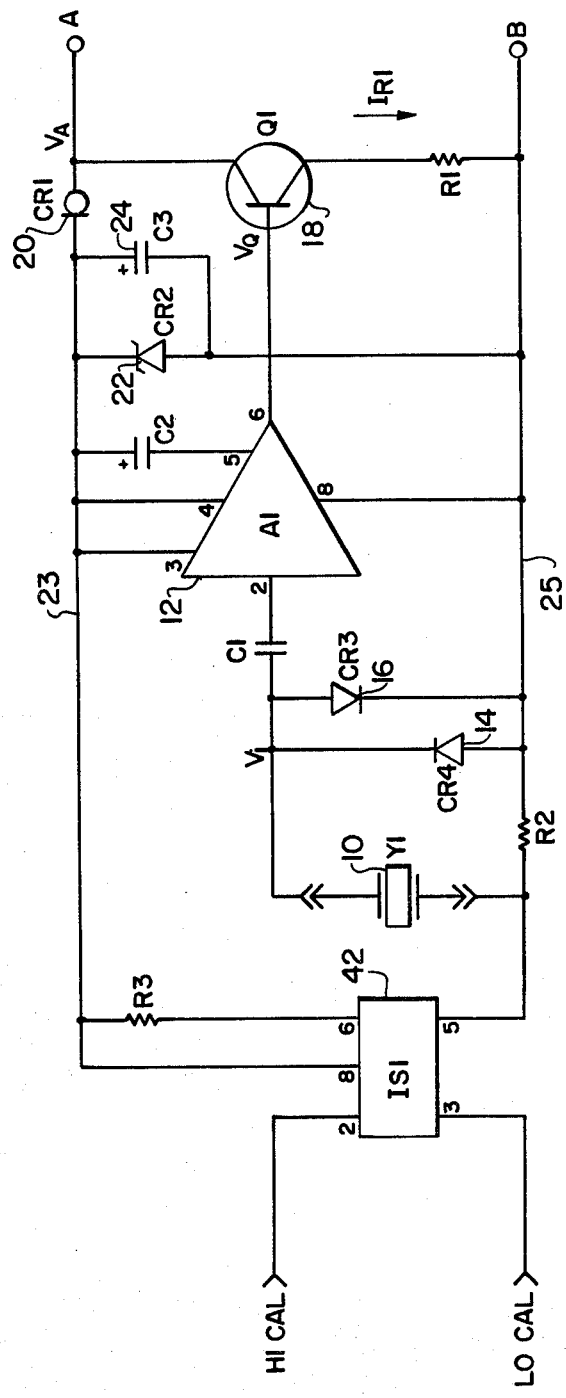
FIG. 1 is a schematic diagram of an embodiment of the invention showing a hydrophone with a preamplifier.

Referring to FIG. 1, a piezoelectric hydrophone Y1(10) is coupled to the input terminals (2 and 8) of a hybrid microcircuit amplifier A1(12) through an input condenser C1 and a low-valued resistor R2, hydrophone, condenser and resistor being in series. The device provides an impedance transformation to match the hydrophone crystal to the remaining circuitry and also 20 dB of voltage gain.

Diodes CR3 and CR4 (14 and 16) are placed across the amplifier input in opposite polarity to protect it against excessive input voltages. Ordinary acoustic signals do not produce enough hydrophone output to cause these diodes to conduct. (Each requires 0.4 Volts to conduct and the input to the amplifier is protected against signals as high as 50 Volts peak-to-peak.) Excessive hydrophone outputs (caused for example, by dropping the hydrophone) are shunted through the diodes, leaving the circuitry unharmed.

The output voltage, $V_O$, produced at pin 6 of the amplifier A1 is converted to an output current by transistor Q1(18). The current, $I_{R1}$, consists of a quiescent DC component plus an AC signal component. The high side of Q1 couples with the terminal of the preamp which connects with the high side of the DC supply voltage source ($V_{cc}$) through a two-wire cable which carries both the DC supply current and the AC output signal to the remote load ($R_L$).

A DC constant-current diode CR1 (20) provides the supply current to the amplifier. One side of the diode CR1 is connected to the supply source terminal A and the other side of the diode is its output, or constant-current, terminal 21. A zener diode CR2(22) establishes the DC supply voltage for the amplifier A1. This zener diode and the filter capacitor C3(24) compensate for all variations in the amplifier's supply current. Thus, while the current in the constant-current diode CR1 remains fixed, the amplifier A1 can demand a varying supply current. The difference is automatically taken up by diode CR2 and filter capacitor C3, which together form a current-compensation means.

Figure 2:
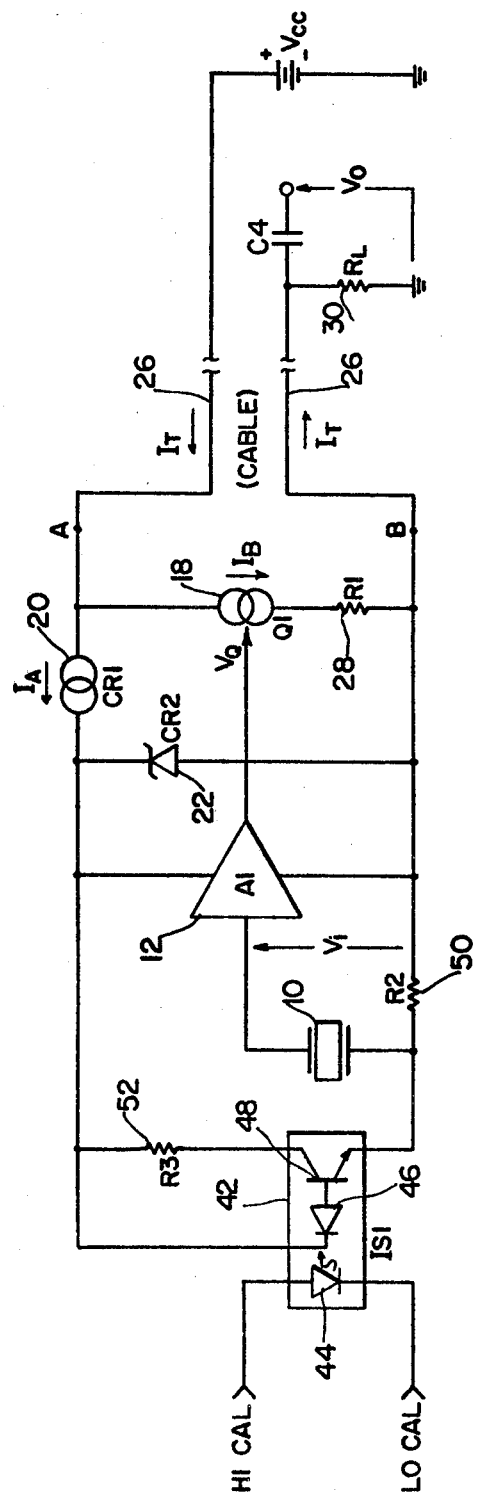
FIG. 2 is a simplified version of FIG. 1, also including some load circuit information.

FIG. 2 shows a simplified diagram of the preamplifier (hereinafter called "preamp") connected through a twisted-pair cable 26 to a remote load resistor $R_L$ (30). The total current $I_T=I_A+I_B$ and $I_A$, as previously mentioned, is maintained at a constant value by diode CR1. The current $I_B$ through Q1 is $I_B=I_{BDC}+i_{BAC}$, where $I_{BDC}$ is a constant DC bias and $i_{BAC}$ is the intelligence-carrying, AC signal current.

At the load end of the cable, the output voltage $V_o=i_{BAC}R_L$.

Regulator Q1 controls $i_{BAC}$:

$$i_{BAC}=V_{QAC}/R1$$

where $V_{QAC}$ is the AC component of the output voltage, $V_Q$, of the preamp and R1(28) is the emitter resistor of Q1.

Let $G_{A1}$ be the voltage gain of the preamp A1. Then, $$V_{QAC}=V_iG_{A1}$$

$$i_{BAC}=V_iG_{A1}/R1$$

$$V_o=(V_iG_{A1}/R1)R_L$$

$$(V_o/V_i)=G_{A1}(R_L/R1)$$

The last equation defines the preamp's overall voltage gain. Note that the gain is independent of any cable resistance. $R_L(30)$ can be made as small as desired to minimize cross-talk from other array outputs. Post-amplification can be used, if desired to compensate for the $R_L/R1$ factor.

Figure 3:
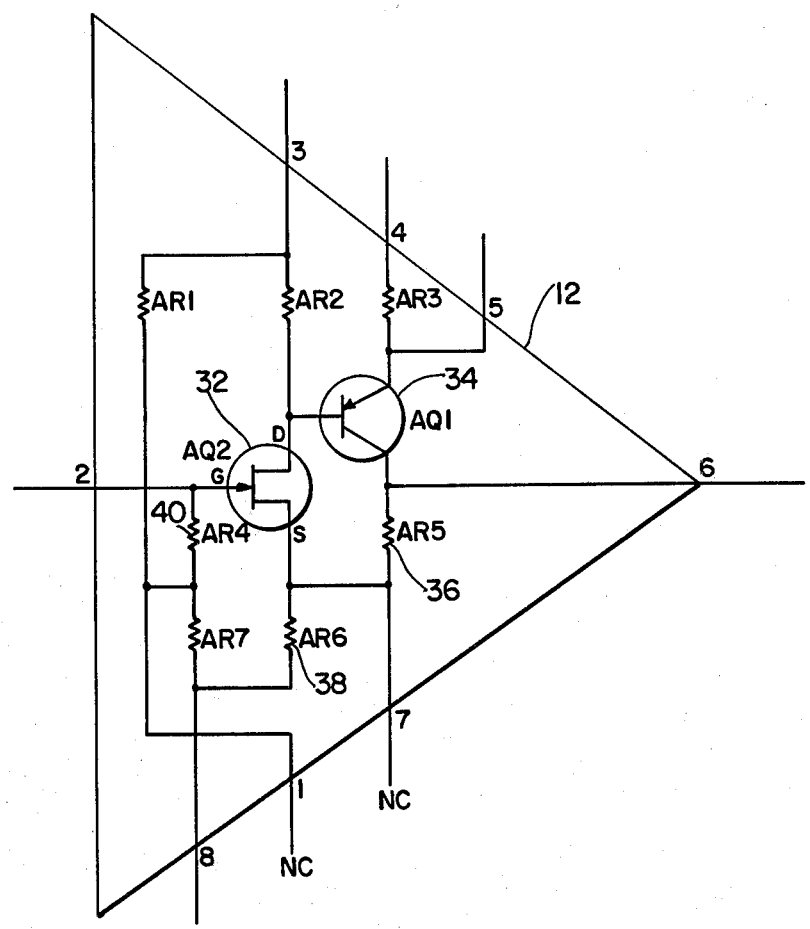
FIG. 3 is a schematic diagram of the hybrid microcircuit amplifier.

FIG. 3 shows a schematic of the hybrid microcircuit amplifier, A1, which is packaged in a low-profile can. Noise is minimized by keeping the gate-to-source (G-to-S) voltage of the input field-effect transistor AQ2(32) low and by using only low-noise components in the circuit. The input of this amplifier is at pin 2 and the output at pin 6. A supply voltage of 12 V.DC is applied at pins 3 and 4 by connection directly to, or to a line 23(the "hot" line) which connects with the constant-current terminal 21. Ground is placed on pin 8 through a line 25 (the "low" line) which connects with the remote load terminal B, which connects with the remote load $R_L(30)$ through one wire of cable 26 (see FIG. 2). A second transistor AQ1 (34) provides additional amplification to give a total voltage gain of approximately 20 dB. This is defined by the expression:

$$\text{AC Gain} \approx 20 \log_{10}(AR5+AR6)/AR6$$

Resistors AR5 (36) and AR6(38), in addition to setting the gain, provide negative feedback which makes this device very stable with temperature. To a first-order approximation, the DC conditions in the circuit are defined by the following equations:

$$V_g = \frac{V_{cc}(AR7)}{AR1 + AR7}$$
$$V_s = (I_c + I_d)AR6$$
$$V_{gs} = V_g - V_s$$
$$V_o = V_s + I_cAR5$$
$$I_d = \frac{I_cAR3 + V_{be}}{AR2} = I_{dss}\left[1 - \frac{|V_{gs}|}{|V_p|}\right]^2$$

where
$V_g$=gate voltage of AQ2
$V_s$=source voltage of AQ2
$V_o$=collector voltage of AQ1
$V_{cc}$=DC supply voltage at pins 3 and 4
$V_{be}$=base-emitter voltage of AQ1
$V_p$=pinch-off voltage of AQ2
$I_d$=drain current of AQ2
$I_c$=collector current of AQ1
$I_{dss}$=saturated drain current of AQ2

All of the above are DC values.

The gate-to-source (G-to-S) electrodes of AQ2 are reverse-biased so that the input impedance at pin 2 is approximately the value of resistor AR4(40). The high-frequency cut-off is determined by the shunt capacitance at pin 2 and the bandwidths of AQ1 and AQ2. This frequency is well beyond the audio range.

As has been noted, the preamplifier circuit has two stages. The input is a low-noise, junction field-effect transistor (JFET) circuit designed so that the gate-to-source and gate-to-drain junctions are reverse-biased. This means that the JFET appears to be an open circuit when viewed from its gate terminal. The leakage current flowing out of the gate is usually negligible, especially at the low temperatures encountered by hydrophones.

Resistors AR1 and AR7 form a voltage divider, producing a gate bias, $V_g$, which is coupled to the gate terminal by AR4. Resistor AR4 is usually much larger than AR1 or AR7 and is essentially the input impedance of the preamplifier. The voltage produced by the piezoelectric crystal, Y1, is coupled to the gate of AQ2 by capacitor C1 whose capacitance is made much greater than that of the crystal so that there is little signal loss through C1.

The preamp output stage is formed by AQ1, AR3, C2, and AR5. This is a common emitter stage whose output is fed back to the input stage by AR5. Negative DC feedback is achieved by AR3 and AR6, which stabilizes the DC biasing of the circuit.

Bypass capacitor C2 provides an AC ground for the emitter of AQ1, increasing gain of the input stage. The output signal is coupled to the load by C4 (see FIG. 2). The time constants AR3C2 and $R_LC4$ should be much larger than $AR4C_y$ ($C_y$ is the capacitance of the hydrophone crystal). If this is true, then the low-frequency rolloff of the circuit can be set by AR4 and $C_y$.

Because of the presence of C2, the drain terminal of AQ2 will have little AC signal present. The feedback network formed by AR5 and AR6 forces the signal at the source and gate terminals of AQ2 to be nearly the same. This reduces the effects of the AQ2 junction capacitances, enhancing high-frequency operation. High-frequency rolloff can be introduced, if desired, by shunting AR5 with a small capacitor.

Figure 4:
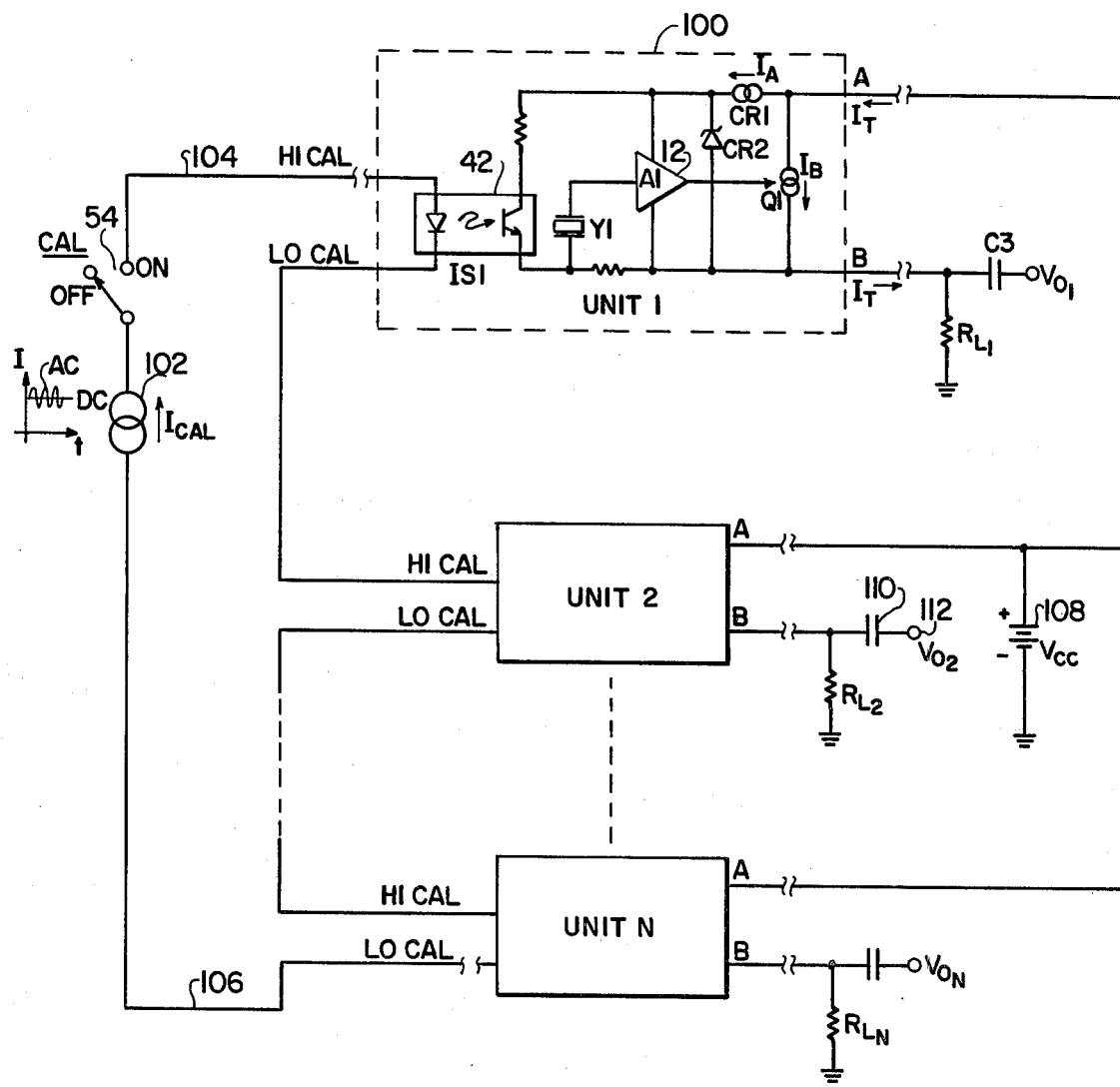
FIG. 4 is a simplified block and schematic illustration of a hydrophone array and a calibration circuit.

An optoisolator IS1(42) is used to couple-in a calibration signal, as shown in FIG. 4. The calibration signal current, $I_{cAL}$, consists of a DC bias component and an AC signal component. The optoisolator IS1 includes a light-emitting diode 44, a photodetector diode 46 and a transistor 48. The DC component of the calibration signal biases the optoisolator into a linear portion of its transfer characteristic, creating a DC current through resistors R2(50) and R3(52) and creating a small DC voltage on the R2 side of the hydrophone crystal. The AC signal component is sinusoidal and transfers linearly across the optoisolator to modulate the DC voltage established at the R2 side of the hydrophone. In this manner, a sinusoidal calibration signal is placed in series with the hydrophone crystal. When no calibration is desired, the calibration signal is switched off by means of a calibration switch 54. Pin 5 (to the emitter of transistor 48) then becomes an open circuit and the preamp responds normally to acoustic signals from the hydrophone. The presence of resistor R2 in series with the hydrophones has no detrimental effect because the input impedance of the amplifier A1 is about 1000 times higher than that of resistor R2.

FIG. 4 shows how a number, N, of preamplifier units 100 may be wired to the calibration signal source 102 and to their load circuits. Since the units 100 are wired in series for the calibration signal, only one set of two wires 104 and 106, is required to carry the signal from the source 102 to the units of the array. The rest of the calibration inputs can be connected right at the array.

Only two wires are required to connect each preamp unit to its remote load, $R_L$, and its DC supply source, $V_{cc}$ (108). Actually, all A outputs can be connected together at the array and only a single wire used to connect the positive side of $V_{cc}$ to an A output terminal of one preamp unit if desired.

A blocking capacitor 110 is used between the high side of the output load impedance $R_L$ and the remote output signal terminal 112 to block DC current from the terminal 112.

A list of typical components is provided below:
IS1—Hewlett-Packard 5082-4350
R1—RN55C: R1 is selected to set $I_{R1}$ @ 2.5 ma±5%, for $V_A$=30VDC, $V_i$=0, $T_A$=25° C.
R2—2.49 KΩ, RN55C
R3—100 KΩ, RN55C
CR1—1N 5306
CR2—1N 5532D
CR3—2N 929
CR4—2N 929
C1—0.068 μf, CK05
C2—39 μf, 10V, CSR13
C3—68 μf, 15V, CSR13
AR1—510 KΩ, 1%
AR2—13 KΩ, 1%
AR3—9.1 KΩ, 1%
AR4—25 MΩ, 5%
AR5—15 KΩ, 1%
AR6—1.5 KΩ, 1%
AR7—9.1 KΩ, 1%
AQ1—2N3251A
AQ2—2N4867
Q1—2N4104
$R_L$—40.2Ω
Capacity of Y1≈635 pf To summarize advantages and features of the present invention:

This preamp uses a current driver, Q1, in a 2-wire configuration to allow input power and output signal to share a single pair of wires. It also allows the use of an arbitrarily small load resistor to minimize crosstalk. The use of current drive produces an output signal across the load, $R_L$, which is independent of any capable resistance.

The preamp completely controls the cable current —both supply and signal. This prevents contamination of the signal current by variations in the supply current, a problem for some of the older systems. Total current regulation by the preamp is a distinct advantage over older systems. Separation of the signal from the DC component is accomplished at the load by means of a simple coupling capacitor 110. By using total current regulation, the circuit cannot be damaged by a short circuit to ground at either output terminal.

The unique calibration method used in this invention provides many advantages. Use of an optoisolator to couple in a sinusoidal calibration signal which is in series with the hydrophone crystal allows any number of preamp units to be calibrated simultaneously with an identical signal merely by connecting the calibration input terminals in series. This method prevents the failure of any component in the isolator from affecting normal operation of the hydrophone and preamp unit. The use of optical gaps also isolates the preamps from one another in an array, thus preventing crosstalk, even though all share the same calibration input cable.

Other advantages include the ability to withstand input overloads without damage (diodes CR3 and CR4), low noise, and wide dynamic range. Measurements show a dynamic range of 110 dB and a self-noise of less than −124 dBV, referred to the input.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A preamplifier for use with an AC signal source and having terminals for connection to a two-wire cable, one wire of which goes to a remote load and the other wire of which goes to a remote DC voltage supply source comprising, in combination:
   amplifier means for producing an amplified voltage input signal corresponding to the signals from said AC signal source, said amplifier means also having terminals for connection to said remote DC supply source terminal and said remote-load terminal;
   current driver means, receiving the output of said amplifier means, for converting the AC output signal to a corresponding signal current having a DC level on which the AC signal components are superimposed, said current driver means having terminals for connection to said remote DC supply source terminal and said remote-load terminal;
   constant-current supply means, inserted in series with the DC supply source by being connected between the DC supply source terminals of said amplifier means and said current driver means, for maintaining a constant DC current supply at its amplifier-means side;
   current-compensation means, connected across said amplifier means from its DC supply voltage terminal to its remote-load terminal, for compensating for the difference between the constant current supplied by said constant-current supply means and the varying current demand of said amplifier means; and
   optoisolator means for coupling an AC calibration signal to the input of said amplifier means.

2. A preamplifier as in claim 1, wherein said calibration signal is coupled to the input terminals of said amplifier means in series with the signal from the AC source.

3. An array of N preamplifiers as set forth in claim 1, wherein:
   each optoisolator means has a high calibration and a low calibration input terminal, the high calibration terminal of the first and the lower calibration terminal of the Nth optoisolator means being open for connection to source of AC calibration signals and the other input terminals being connected in series so that the low calibration terminal of the first is connected to the high calibration terminal of the second optoisolator means, and so on, whereby the AC calibration signal will be connected in series with all optoisolator-means inputs.

4. A preamplifier for use with an AC signal source and a two-wire cable, one wire of which goes to a remote load and the other side of which goes to a remote DC voltage supply source, said preamplifier comprising, in combination:
   first means, designated "hot line", for carrying an electrical current;
   second means, designated "low line", for carrying an electrical current;
   amplifier means, connected to a source of AC signals and also to said hot line and to said low line, for producing an amplifier voltage output signal corresponding to the signals from said AC signal source:
   current driver means, receiving the output of said amplifier means, for converting the AC output signal to a corresponding signal current having AC signal components super-imposed on a DC level, said driver means being connected to the hot line and to the low line;
   constant-current supply means, inserted in series with the DC supply source by being connected in said hot line between the connections to said current driver means and said amplifier means, for maintaining a constant DC current supply at the amplifier-means side of said constant-current supply means;
   current-compensation means, connected across the output side of said amplifier means for the hot line to the low line, for compensating for the difference between the current delivered by the constant-current supply means and the varying current demanded by said amplifier means,
   said hot line being connectable to the hot side of said DC supply source through said constant-current supply means and one wire of said two-wire cable, and
   said low line being connectable to the grounded side of said DC supply source through the other wire of said two-wire cable and said remote load; and
   optoisolator means for coupling an AC calibration signal to the input of said amplifier means.

5. A preamplifier as in claim 4, wherein said calibration signal is coupled to the input of said amplifier means in series with the signal from the AC source.

6. An array of N preamplifiers as set forth in claim 4, wherein:
   each optoisolator means has a high calibration and a low calibration input terminal, the high calibration terminal of the first and the low calibration terminal of the Nth optoisolator means being open for connection to a source of AC calibration signals and the other input terminals being connected in series so that the low calibration terminal of the first is connected to the high calibration terminal of the second optoisolator means, and so on, whereby the AC calibration signal will be connected in series with all optoisolator-means inputs.

* * * * *